(12) United States Patent
Smith et al.

(10) Patent No.: US 8,258,875 B1
(45) Date of Patent: Sep. 4, 2012

(54) DC-DC CONVERSION FOR A POWER AMPLIFIER USING THE RF INPUT

(75) Inventors: Malcolm Smith, San Jose, CA (US); Matthew Anthony Mow, Cupertino, CA (US)

(73) Assignee: Amalfi Semiconductor, Inc., Los Gatos, CA (US)

(*) Notice: Subject to any disclaimer, the term of this patent is extended or adjusted under 35 U.S.C. 154(b) by 127 days.

(21) Appl. No.: 12/893,193

(22) Filed: Sep. 29, 2010

Related U.S. Application Data

(60) Provisional application No. 61/246,680, filed on Sep. 29, 2009, provisional application No. 61/246,672, filed on Sep. 29, 2009, provisional application No. 61/246,740, filed on Sep. 29, 2009, provisional application No. 61/246,744, filed on Sep. 29, 2009, provisional application No. 61/246,762, filed on Sep. 29, 2009.

(51) Int. Cl.
*H03F 3/04* (2006.01)

(52) U.S. Cl. ........ 330/297; 330/127; 330/129; 330/136; 330/296

(58) Field of Classification Search .................. 330/297, 330/127, 136, 296, 112, 129
See application file for complete search history.

(56) References Cited

U.S. PATENT DOCUMENTS

| | | | | |
|---|---|---|---|---|
| 6,011,440 A * | 1/2000 | Bell et al. | ...... | 330/297 |
| 6,104,248 A * | 8/2000 | Carver | ...... | 330/297 |
| 6,914,487 B1 * | 7/2005 | Doyle et al. | ...... | 330/297 |
| 7,167,054 B1 * | 1/2007 | Dening et al. | ...... | 330/297 |
| 7,554,408 B2 * | 6/2009 | Chen et al. | ...... | 330/297 |
| 7,782,141 B2 * | 8/2010 | Witmer et al. | ...... | 330/297 |
| 2009/0116663 A1 * | 5/2009 | Buuck | ...... | 381/94.8 |

* cited by examiner

*Primary Examiner* — Patricia Nguyen
(74) *Attorney, Agent, or Firm* — Paul Davis; Goodwin Procter LLP

(57) ABSTRACT

A power amplifier system is provided that includes a power amplifier configured to receive an RF input. A DC-DC converter is coupled to the power amplifier. Clocking circuits drive the DC-DC converter. The clocking circuits use the RF input to generate a clock. The clock acts with the DC-DC converter to provide an output voltage used in the power amplifier.

28 Claims, 5 Drawing Sheets

DC-DC CONVERSION FOR A POWER AMPLIFIER USING THE RF INPUT

CROSS-REFERENCE TO RELATED APPLICATIONS

This application claims the benefit of U.S. Ser. No. 61/246,680 filed Sep. 29, 2009 and is related to U.S. Ser. No. 61/246,672, U.S. Ser. No. 61/246,740, U.S. Ser. No. 61/246,744, and U.S. Ser. No. 61/246,762, all filed on Sep. 29, 2009. All of the above-identified applications are fully incorporated herein by reference.

BACKGROUND

1. Field of the Invention

This invention relates generally to power amplifiers, and more particularly to the DC-DC conversion of power amplifiers using an RF input.

2. Description of the Related Art

Power amplifiers are sized to deliver a certain maximum power at maximum efficiency for a nominal supply voltage (in the case of Li Ion based battery cells, this voltage is about 3.6V). The load presented to the amplifier is fixed as the load that delivers the best performance at the maximum power which means that the output swing of the amplifier makes use of all the available range of the supply voltage. As the power delivered decreases, the load remains the same which means that the voltage swing at the output of the power amplifier decreases (as $P=V^2/R$). With a smaller swing, some of the available supply voltage range is wasted and consequently some power is wasted. If the supply is lowered using an efficient DC-DC converter, the output swing will now take up the available supply range and so there is no power wasted.

Also, in some power amplifier technologies (CMOS being and example) it is advantageous so have bias voltages for some of the transistors that are outside the range of the supply voltages. These voltages require a DC-DC converter to generate and this DC-DC needs to have a high efficiency.

Most power amplifiers used in cell phones have, until recently, been built using GaAs as the substrate material with HBT (heterojunction). Although switching DC-DC converters have been used with GaAs HBT power amplifiers, they have been on a separate silicon die and include their own clock. There is also no need to cascade the transistors of a GaAs HBT power amplifier, and so there has been no need to generate voltages higher than the power supply which means that GaAs HBT power amplifiers do not contain charge pumps.

A DC-DC converter switches a semiconductor switch device to convert a DC voltage, and conducts feedback control to maintain an output voltage supplied to a load at a certain value. The device requires a reactive element (inductor or capacitor) to store energy during one part of the switching, when the semiconductor device is on, and release it back when the semiconductor device is off. In the case where a lower voltage is desired, energy is stored in the reactive element for the same ratio of the full cycle as the ratio of the input voltage to output voltage, the current required by the load during the off portion being stored during the on portion of the cycle. In the case of a need to generate a higher voltage than the input voltage, one terminal of the energy storage reactance is switched between a lower voltage and a higher voltage to drive the voltage at the output higher. All forms of converter require a clock for switching. Some form of low pass filtering is also required to ensure that the output is relatively smooth with little ripple.

A step-down (higher voltage to lower voltage) is known as a "buck converter". A step-up converter is known as a "boost converter". There are also "buck-boost" converters that in one mode will operate as a buck converter (step a voltage down) and in another mode will operate as a boost converter (step a voltage up). Buck, boost and buck-boost converters use an inductor to store energy in the magnetic domain and can reach extremely high efficiencies in the region of 95% or more while delivering large amounts of current (a typical cellphone application would require currents measured in the Amperes during operation). The inductor needs to have low loss and be able to handle a large current. For efficiency reasons the DC-DC trends to be driven at relatively low frequency (several mega-Hertz) to limit the energy wasted in switching and so the inductor needs to have a high value to be able to store a lot of energy during the limited switcher on period. These factors lead to a need for a physically large inductor which in a cellphone application where space is at a premium.

A charge pump DC/DC converter is a power supply circuit that provides a regulated output voltage to a load from an input voltage source. One type of charge pump DC/DC converter is a switching DC/DC converter power supply that uses switches to convert the input voltage to a regulated output voltage. The switches are operated in sequence to first charge a capacitor from the input voltage and then transfer the charge to the output. An inverting charge pump operates by charging a "pump" capacitor during a clock's first half-cycle, or "pumping phase", to the level of a source voltage. During the clock's second, non-overlapping half-cycle, or "transfer phase", the pump capacitor is disconnected from the source and connected, with its polarity switched, to a second "reservoir" capacitor, thereby "pumping" charge to the reservoir capacitor and providing an output which is approximately the negative of the input voltage.

Similarly, with a minor rearrangement of the pump's switching elements, a step-up converter is produced. During the clock's first half-cycle the pump capacitor is charged to the level of the source voltage. During the clock's second half-cycle, the pump capacitor's positive side is disconnected from the source and its negative side, which had been connected to ground during the first half-cycle, is connected to the source. The positive side, now at twice the source voltage, is connected to the reservoir capacitor, thus charging it to twice the source voltage.

Other exemplary switch network configurations are directed to the generation of different output voltages as a function of the source voltage, e.g., a selectable bipolar doubled output voltage.

Although the charge pump requires few parts and no inductors, its main drawback is that the capacitors used are not able to store significant amounts of energy and so the load that the charge pump can drive is limited. However in applications where the load is purely capacitive and does not vary, the charge pump is a good solution for generating voltages. The gate of a MOSFET is such a purely capacitive load, and so a charge pump is a good solution for generating bias voltages for cascodes, wells, or even RF transistors.

In power amplifiers it is often necessary to generate voltages that are higher, or potentially lower, than the supplies in a manner that is efficient. For this reason, DC-DC converters, whether inductor based or charge pump based, are useful. This is particularly the case for power amplifiers made using a CMOS process as they tend to have a more complicated structure than those made in other processes and require voltages outside the range of the power supply voltage supplied to the part.

SUMMARY

An object of the present invention is to provide an improved power amplifier system.

Another object of the present invention is to provide a power amplifier system where the frequency is known and controlled.

A further object of the present invention is to provide a power amplifier system with no external clock.

Yet another object of the present invention is to provide a power amplifier system where the frequency is tailored to lie at a frequency which will limit the interference of the clock on the overall output of the power amplifier.

These and other objects of the present invention are achieved in, a power amplifier system that includes a power amplifier configured to receive an RF input. A DC-DC converter is coupled to the power amplifier. Clocking circuits drive the DC-DC converter. The clocking circuits use the RF input or the RF input after it has been gained up by the power amplifier to generate a clock. The clock acts with the DC-DC converter to provide an output voltage used in the power amplifier.

In another embodiment of the present invention, a power amplifier system includes a power amplifier configured to receive an RF input. A DC-DC converter is coupled to the power amplifier. Clocking circuits drive the DC-DC converter. The clocking circuits use the RF input or the RF input after it has been gained up by the power amplifier to generate a clock. The clock is generated from an RF signal present at an intermediate node or an output of the power amplifier.

DETAILED DESCRIPTION

Figure 1:
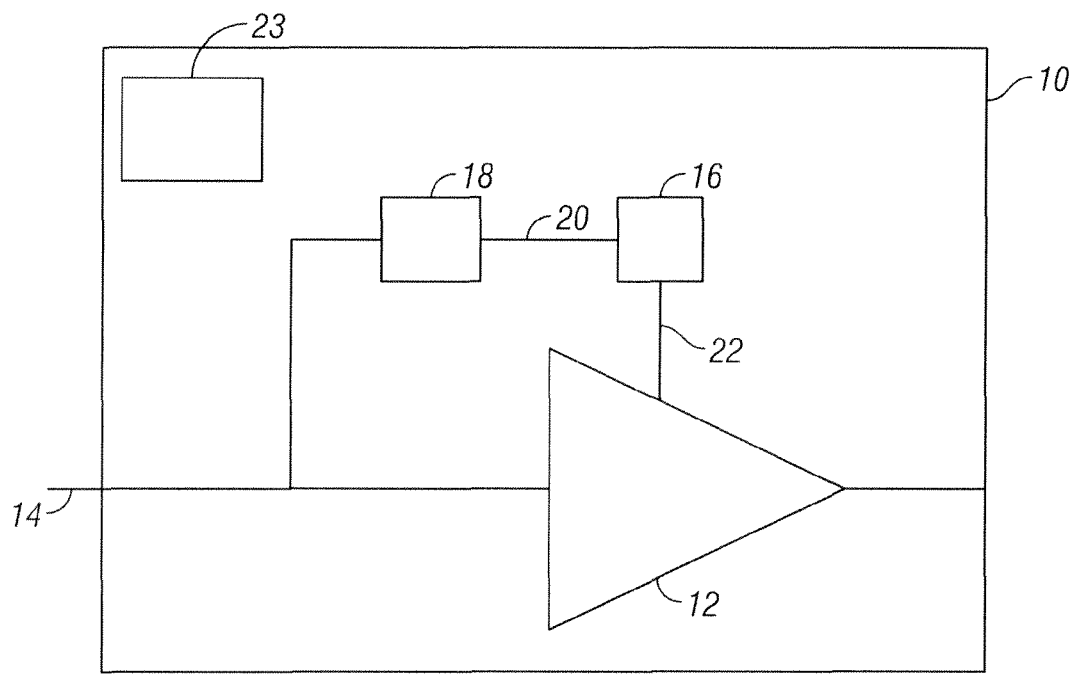
FIG. 1 illustrates one embodiment of a power amplifier system of the present invention.

In one embodiment of the present invention, as illustrated in FIG. 1, a power amplifier system 10 includes a power amplifier 12 configured to receive an RF input 14. A DC-DC converter 16 is coupled to the power amplifier 12. Clocking circuits 18 drive the DC-DC converter 16. The clocking cir-cuits 18 use the RF input 14 to generate a clock 20. The clock 20 acts with the DC-DC converter 16 to provide an output voltage 22 used in the power amplifier 12. The clocking circuits 18 square up the RF input to generate the clock 20. In one embodiment, the clock 20 is between high and low bands of the power amplifier 12 to minimize the clock interference of the high and low bands. A digital serial interface 23 can be included to control the clock 20. The serial interface is used to program registers which change settings in the circuits enabling us to change performance, for instance, decreasing the number of stages of division to get a higher frequency clock.

Figure 2:
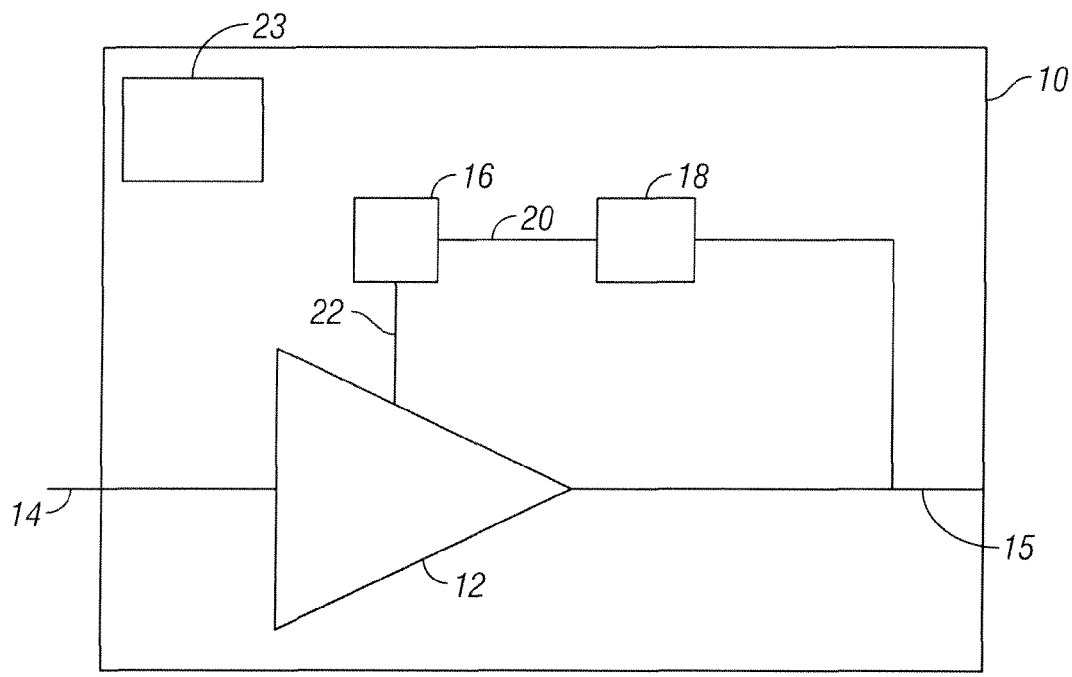
FIG. 2 illustrates an embodiment of a power amplifier system of the present invention with clocking circuits that use an RF output to generate a clock.

In another embodiment of the present invention, illustrated in FIG. 2, a power amplifier system 10 includes a power amplifier 12 configured to receive an RF input 14 and generate an RF output 15. The clocking circuits 18 use the RF output 15 to generate a clock 20. The clock 20 acts with the DC-DC converter 16 to provide an output voltage 22 used in the power amplifier 12. The clock switches the transistors of the converter and this switching action in combination with an energy storage element gives the voltage buck or boost.

Figure 3:
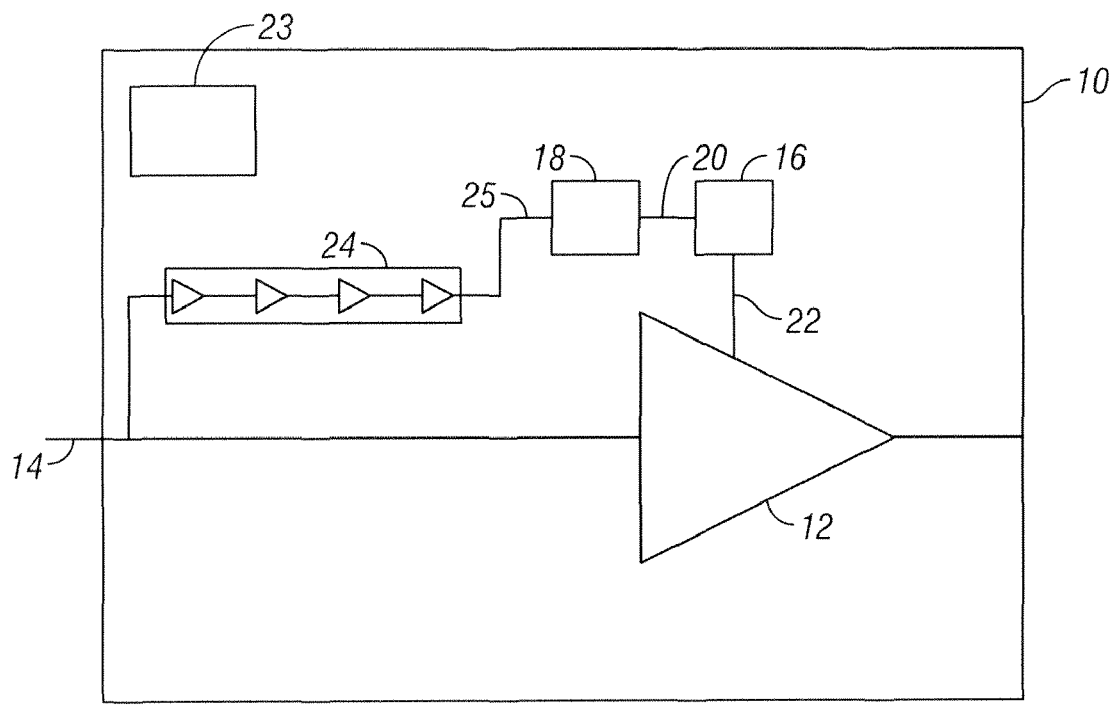
FIG. 3 illustrates an embodiment of a power amplifier system of the present invention with a multiple stage buffer coupled to a clock.

As illustrated in FIG. 3, a multiple stage buffer 24 can be coupled to the clock 20. Additionally, a buffering can be coupled to the clock 20. The multiple stage buffer 24 squares up the clock 20 and provide isolation between the clocking circuits 18 and the RF input 14. The buffering is achieved by the buffer circuits switching on and off. This results in little feedback from the output to the input which is what the isolation is.

All implementations of DC-DC converter require some form of clock. The clock is not a normal part of a power amplifier and so has to be supplied from an external source or generated on chip. With on-chip clock generation there is added area required to build the clock. The added area is on the power amplifier die. The die area comes at a premium and anything that can reduce the area reduces cost. Additionally, to limit interference with other users, the clock has to be at a very low frequency. The closest GSM channel is 200 kHz away, requiring the clock to be much less than this or at a higher high frequency, as a non-limiting example greater than about 250 MHz. Low frequency components need more area because larger reactances are required. High frequency and small oscillators are not easy to design and are inefficient.

There is also a potential problem with spurs in the output RF signal at multiples of the clock frequency. With an external clock, the clock can couple both going onto the chip, through bond-wires for instance, as well as on-chip and so cause spurs. For certain RF transmit frequencies, a harmonic of the clock would lie close to the transmit channel (but not in the transmit channel) and so, in the case of a power amplifier being used in a cellphone, would cause the cellphone to fail the RF spectrum requirements for those frequencies. Using a divided down input clock ensures that harmonics of the clock can never fall close to the channel, e.g., they are always on top of the channel, and any harmonic will fall at the same frequency as the output signal, but will be much smaller, and does not violate the spectrum requirements. The clock frequency is an integer division of the RF frequency. A harmonic is an integer multiplication of the clock frequency. For a given divide ratio, e.g. n, the $n^{th}$ harmonic of the clock 20 is at the same frequency as the RF, as a non-limiting example 2 GHz divided down by eight to 250 MHz to give the clock 20 and the eighth harmonic of that clock is at 2 GHz.

By way of illustration, and without limitation, the clock 20 can control, a buck type switching regular, a boost type switching regulator, a buck boost type switching regulator, a charge pump, collectively element 26, and the like.

The RF input 14 can be divided down to provide the clock 20 at a sub-harmonic. A sub-harmonic is an integer division of the RF input frequency. Using an integer divider gives a sub-harmonic.

Figure 4:
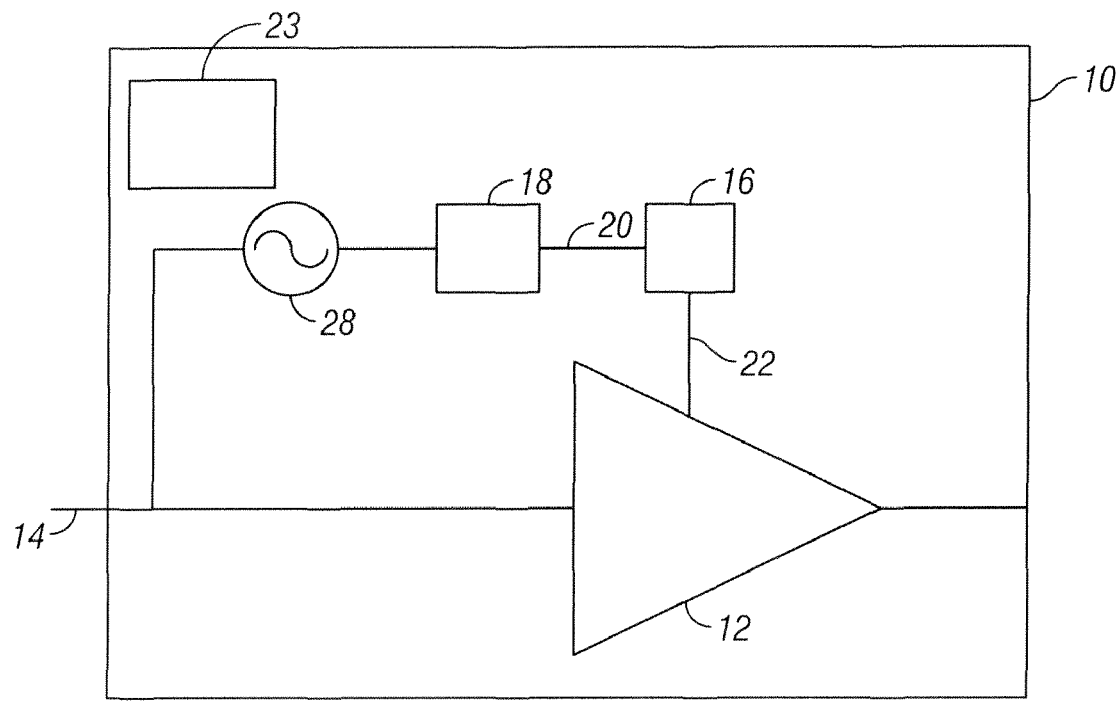
FIG. 4 illustrates an embodiment of a power amplifier system of the present invention with an injection locked oscillator that provides an input to a divider to provide a divided down version of a clock 20 at any harmonic of a fundamental frequency of the RF input.
Figure 5:
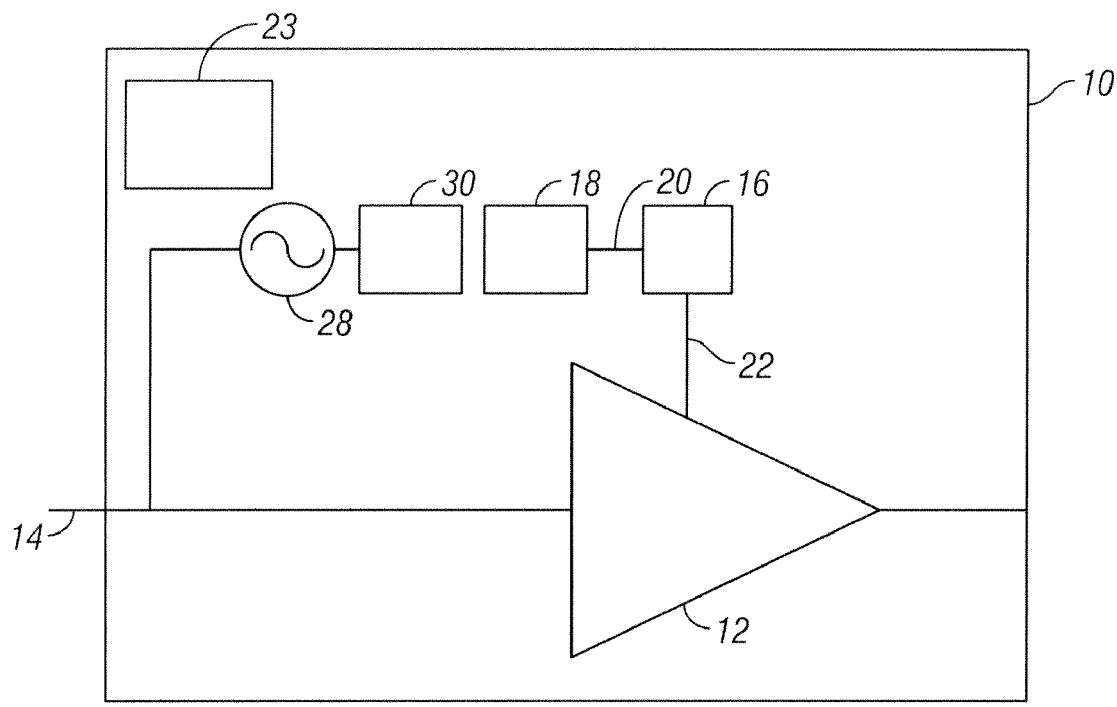
FIG. 5 illustrates an embodiment of a power amplifier system of the present invention where the ratios of a divider can be changed to change a frequency of a clock to minimize interference.

In one embodiment, an injection locked oscillator 28 is centered at a fundamental of a frequency in a middle of a band of the power amplifier 12 that provides the clock 20 locked to the RF input 14. In another embodiment, illustrated in FIG. 4, the injection locked oscillator 28 provides an input to a divider 30 to provide a divided down version of the clock 20 at any harmonic of the fundamental frequency of the RF input 14. In another embodiment, the injection locked oscillator 28 provides an input to the divider 30 to provide a divided down version of the clock 20 at a fundamental frequency of the RF input 14. In one embodiment, the ratios of the divider 30 can be changed to change a frequency of the clock 20 to minimize interference, as illustrated in FIG. 5.

Frequencies that are not integer multiples of the RF input frequency can be generated by mixing together clocks generated by dividing down the RF input. For instance a frequency of 1.5 times the RF frequency can be generated by mixing a clock generated from the RF input signal with one that is generated from a division by two of the RF signal. This could be useful for putting a clock between the two bands (low band and high band). In the high band case, a frequency of ¼ of the RF input signal frequency would be used with a clock generated from the Rx input signal to give a clock at about ¾ times the RF input frequency which is approximately 1.5 times the low band frequency.

In one embodiment, the injection locked oscillator 28 is centered at a harmonic of a frequency in a middle of a band of the power amplifier 12 to provide that the clock 20 locked to the RF input 14. The injection locked oscillator has a limited band of frequencies over which it can lock. By putting it at the middle of the band of the amplifier, or in this case a harmonic of the middle of the band, a lock is created when the power amplifier 12 is operated in its expected band. In another embodiment, the injection locked oscillator 28 is locked to a squared up version of the RF input 14.

Figure 6:
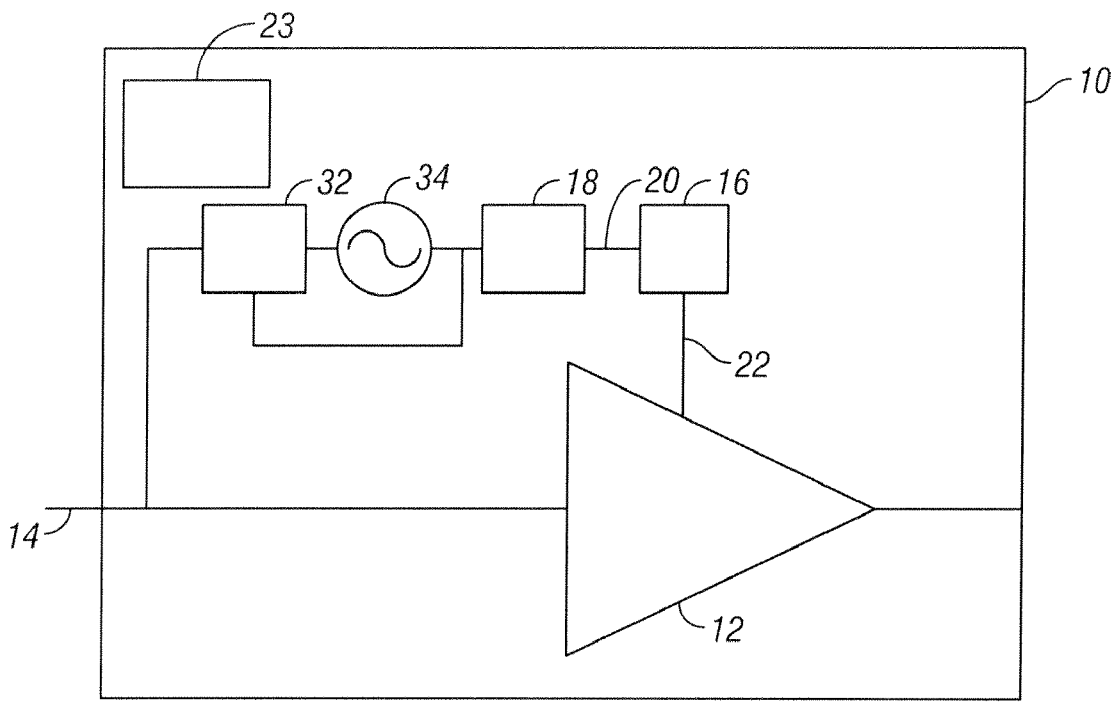
FIG. 6 illustrates an embodiment of a power amplifier system of the present invention with a phase locked loop (PLL) and a voltage controlled oscillator (VCO).
Figure 7A:
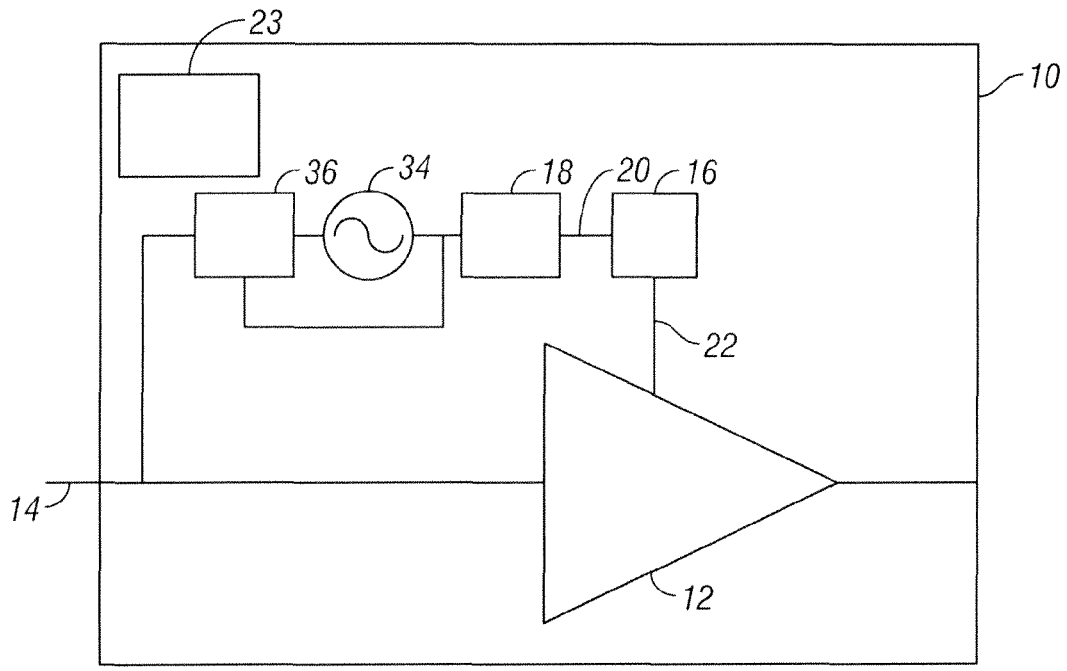
FIGS. 7(a) and 7(b) illustrates an embodiment of a power amplifier system of the present invention where the VCO is locked to the RF input using a frequency locked loop (FLL).
Figure 7B:
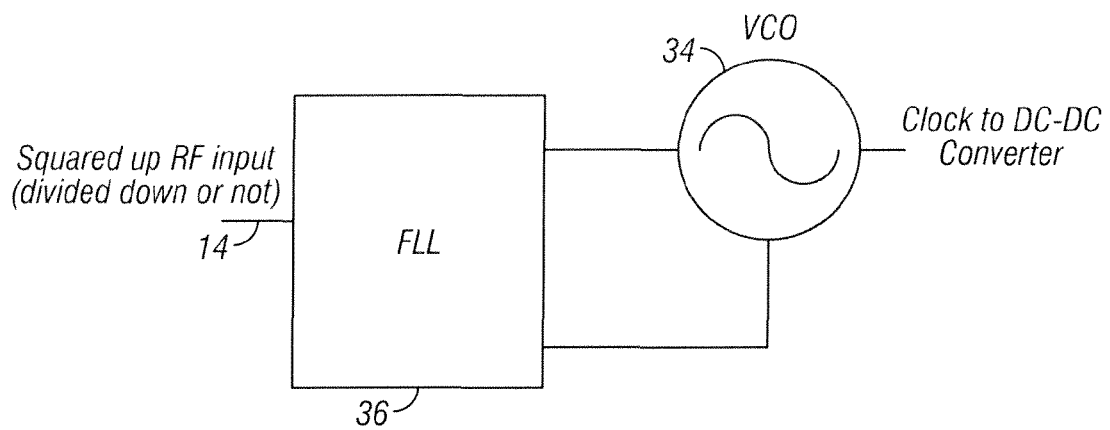
Figure 8A:
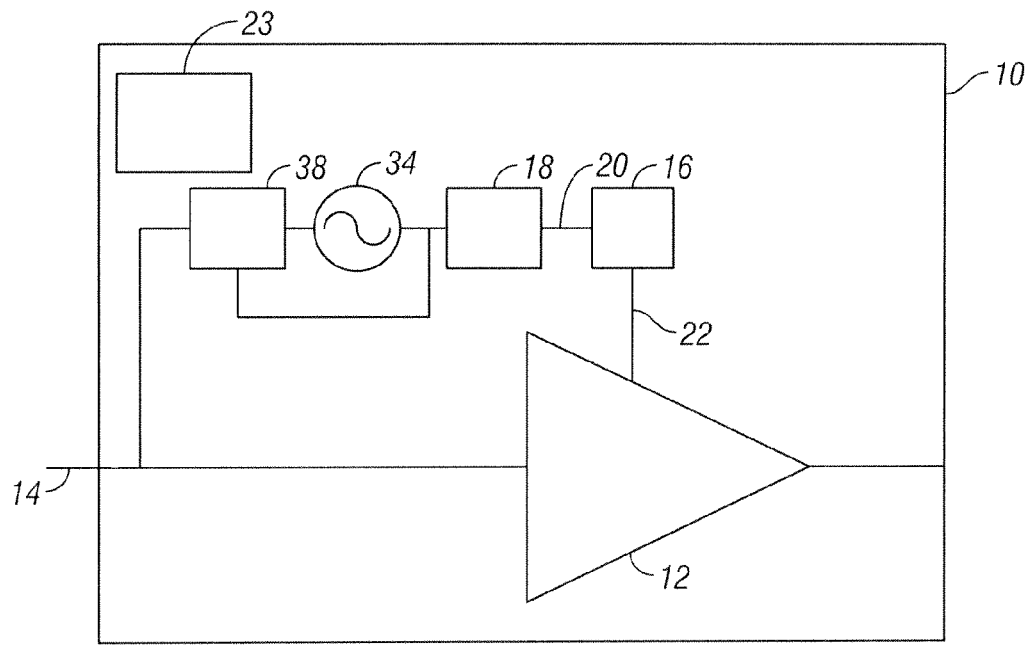
FIGS. 8(a) and 8(b) illustrates an embodiment of a power amplifier system of the present invention where the VCO is locked to the RF input using a delay locked loop (DLL).
Figure 8B:
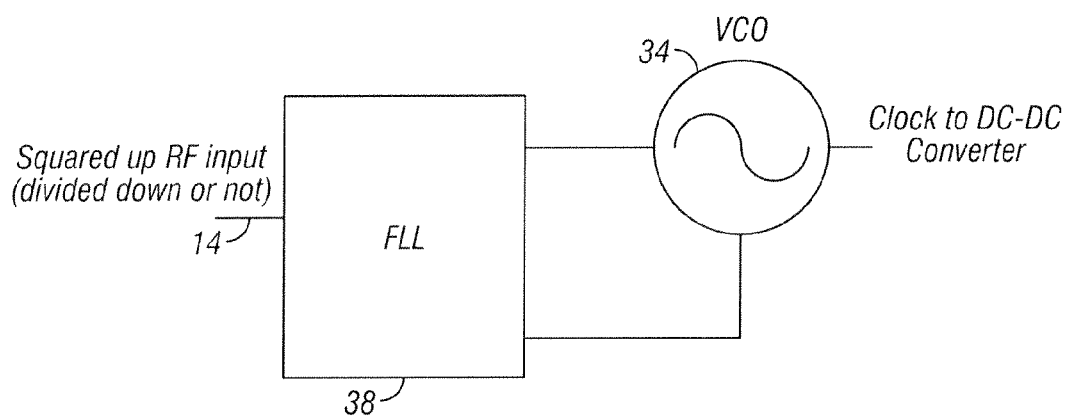

As illustrated in FIG. 6, in another embodiment, a phase locked loop (PLL) 32 and a voltage controlled oscillator (VCO) 34 are provided. The VCO 34 is locked to the RF input 14 using the PLL 32. The VCO 34 can be locked to a divided down version of the RF input 14 using the PLL 32. In one embodiment, the RF input 14 and the VCO 34 are divided down to provide a frequency at which the VCO 34 is operating at a fraction of a frequency of the RF input 14. In another embodiment, illustrated in FIGS. 7(*a*) and 7(*b*), the VCO 34 is locked to the RF input 14 using a frequency locked loop (FLL) 36. The VCO 34 can be locked to a divided down version of the RF input 14 using the FLL 36. In another embodiment, illustrated in FIGS. 8(*a*) and 8(*b*), the VCO 34 is locked to the RF input 14 using a delay locked loop (DLL) 38. The VCO 34 can be locked to a divided down version of the RF input 14 using the DLL 38.

The system 10 can also include, an LC based oscillator, a ring oscillator, collectively element 40, an RC based oscillator, and the like. These elements are used to make VCO 34

Expected variations or differences in the results are contemplated in accordance with the objects and practices of the present invention. It is intended, therefore, that the invention be defined by the scope of the claims which follow and that such claims be interpreted as broadly as is reasonable.

What is claimed is:

1. A power amplifier system, comprising:
a power amplifier configured to receive an RF input;
a DC-DC converter coupled to the power amplifier; and
clocking circuits that drives the DC-DC converter, the clocking circuits using the RF input to generate a clock, the clock acting with the DC-DC converter to provide an output voltage used in the power amplifier, wherein divider ratios are changed to change a frequency of the clock to minimize interference.

2. A power amplifier system, comprising:
a power amplifier configured to receive an RF input;
a DC-DC converter coupled to the power amplifier; and
clocking circuits that drives the DC-DC converter, the clocking circuits using the RF input to generate a clock, the clock being generated from an RF signal present at an intermediate node or an output of the power amplifier, wherein the clock is between high and low bands of the power amplifier to minimize the clock interference of the high and low bands.

3. The system of claim 1, wherein the clocking circuits square up the RF input to generate the clock.

4. The system of claim 1, further comprising:
a multiple stage buffer coupled to the clock, the multiple stage buffer squaring up the clock and providing isolation between the clocking circuits and the RF input.

5. The system of claim 1, further comprising:
a buck type switching regular controlled by the clock.

6. The system of claim 1, further comprising:
a boost type switching regulator controlled by the clock.

7. The system of claim 1, further comprising:
a buck boost type switching regulator controlled by the clock.

8. The system of claim 1, further comprising:
a charge pump controlled by the clock.

9. The system of claim 1, wherein DC generation is provided by a rectified version of the RF.

10. The system of claim 1, wherein the RF input is divided down to provide the clock at a sub-harmonic.

11. The system of claim 1, further comprising:
an injection locked oscillator centered at a fundamental of a frequency in a middle of a band of the power amplifier that provides the clock locked to the RF input.

12. The system of claim 1, further comprising:
an injection locked oscillator; and
a divider, the injection locked oscillator providing an input to the divider to provide a divided down version of the clock at any harmonic of the fundamental frequency of the RF input.

13. The system of claim 1, further comprising:
an injection locked oscillator; and
a divider, the injection locked oscillator providing an input to the divider to provide a divided down version of the clock at a fundamental frequency of the RF input.

14. The system of claim 1, further comprising:
an injection locked oscillator centered at a harmonic of a frequency in a middle of a band of the power amplifier to provide the clock locked to the RF input.

15. The system of claim 1, further comprising:
an injection locked oscillator locked to a squared up version of the RF input.

16. The system of claim 1, further comprising:
a phase locked loop, PLL; and
a voltage controlled oscillator, VCO, wherein the VCO is locked to the RF input using the PLL.

17. The system of claim 1, further comprising:
a frequency locked looped FLL; and
a VCO, wherein the VCO is locked to the RF input using the FLL.

18. The system of claim 1, further comprising:
a delayed lock loop, DLL; and a VCO, wherein the VCO is locked to the RF input using the DLL.

19. The system of claim 1, further comprising:
a PLL; and
a VCO, wherein the VCO is locked to a divided down version of the RF input using the PLL.

20. The system of claim 1, further comprising:
a FLL; and
a VCO, wherein the VCO is locked to a divided down version of the RF input using the FLL.

21. The system of claim 1, further comprising:
a DLL; and
a VCO, wherein the VCO is locked to a divided down version of the RF input using the DLL.

22. The system of claim 1, further comprising:
a VCO, wherein the RF input and the VCO are divided down to provide a frequency at which the VCO is operating at a fraction of an RF input frequency.

23. A power amplifier system, comprising:
a power amplifier configured to receive an RF input;
a DC-DC converter coupled to the power amplifier; and
clocking circuits that drives the DC-DC converter, the clocking circuits using the RF input to generate a clock, the clock being generated from an RF signal present at an intermediate node or an output of the power amplifier, wherein divider ratios are changed to change a frequency of the clock to minimize interference.

24. A power amplifier system, comprising:
a power amplifier configured to receive an RF input;
a DC-DC converter coupled to the power amplifier; and
clocking circuits that drives the DC-DC converter, the clocking circuits using the RF input to generate a clock, the clock acting with the DC-DC converter to provide an output voltage used in the power amplifier, wherein the clock is between high and low bands of the power amplifier to minimize the clock interference of the high and low bands.

25. The system of claim 1, further comprising:
A digital serial interface that controls the clock.

26. The system of claim 1, further comprising:
an LC based oscillator.

27. The system of claim 1, further comprising:
a ring oscillator.

28. The system of claim 1, further comprising:
an RC based oscillator.

* * * * *